(12) United States Patent
Toben-Heiken et al.

(10) Patent No.: US 11,175,337 B2
(45) Date of Patent: Nov. 16, 2021

(54) OVER-THE-AIR MEASUREMENT SYSTEM

(71) Applicant: Rohde & Schwarz GmbH & Co. KG, Munich (DE)

(72) Inventors: Christoph Toben-Heiken, Munich (DE); Christian Riedel, Munich (DE); Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 210 days.

(21) Appl. No.: 16/555,922

(22) Filed: Aug. 29, 2019

(65) Prior Publication Data

US 2021/0063480 A1   Mar. 4, 2021

(51) Int. Cl.
*G01R 31/302* (2006.01)
*H01Q 5/30* (2015.01)
*H01Q 1/50* (2006.01)

(52) U.S. Cl.
CPC .......... *G01R 31/3025* (2013.01); *H01Q 1/50* (2013.01); *H01Q 5/30* (2015.01)

(58) Field of Classification Search
CPC ............ G01R 31/2656; G01R 31/2822; G01R 31/3025; G01R 31/311
See application file for complete search history.

(56) References Cited

U.S. PATENT DOCUMENTS

| 2003/0043002 | A1* | 3/2003 | Martin | ...................... H01P 1/28 333/248 |
| 2015/0054687 | A1* | 2/2015 | Reed | .................... H04B 17/101 342/361 |
| 2018/0337738 | A1* | 11/2018 | Wen | ........................ H04B 17/12 |

FOREIGN PATENT DOCUMENTS

WO    2016/043871 A1    3/2016

* cited by examiner

*Primary Examiner* — Tung X Nguyen
(74) *Attorney, Agent, or Firm* — Christensen O'Connor Johnson Kindness PLLC

(57) ABSTRACT

An over-the-air measurement system for performing over-the-air measurements on a device under test is described. The measurement system comprises a measurement device having several measurement antennas, several waveguides, wherein at least one waveguide is assigned to each measurement antenna, several waveguide-to-cable adapters, and a positioning unit assigned to the measurement antennas. The number of the waveguide-to-cable adapters is at least identical to the number of the measurement antennas. The positioning unit is configured to move the measurement antennas with respect to the waveguide-to-cable adapters.

20 Claims, 3 Drawing Sheets

Pos 1 - Frequency band X

Pos 2 - Frequency band Y

Pos 3 - Frequency band Z

OVER-THE-AIR MEASUREMENT SYSTEM

FIELD OF THE DISCLOSURE

Embodiments of the present disclosure relate to an over-the-air measurement system for performing over-the-air measurements on a device under test.

BACKGROUND

Modern communication devices communicate over-the-air (OTA) with other entities. These devices may communicate via different frequency bands encompassing a large frequency range. Hence, the respective characteristics of the devices have to be tested with respect to these different frequency bands.

For this purpose, a measurement system is known that comprises at least one measurement device with a measurement antenna that inter alia transmits electromagnetic signals towards the device to be tested, also called device under test.

In order to obtain a deeper insight into the characteristics of the device under test, the measurement device may comprise a dual-polarized antenna, for instance a so-called horn antenna, which is connected with two waveguides in order to process differently polarized signals forwarded to the antenna via the waveguides. However, the measurement device may also comprise a single-polarized antenna that is connected with a respective waveguide.

The at least one waveguide connected with the measurement antenna is coupled to at least one cable that forwards respective signals to the measurement device. The at least one cable is connected to the waveguide via a waveguide-to-cable adapter that provides an interface for the respective cable.

Since the measurement antenna and the waveguide assigned thereto limit the usable bandwidth due to physical limitations, for example due to physical limitations of the waveguide geometries, a large frequency range, for instance from 20 to 90 GHz, can only be covered by a single measurement device having several measurement antennas that are different with respect to their geometries. Each measurement antenna and the at least one waveguide connected thereto may establish a measurement unit. Hence, each measurement unit can be assigned to a certain frequency band of the whole frequency range to be covered such that several different frequency bands can be tested by the measurement device due to the several different measurement units.

Furthermore, a feed switch is required in order to switch between the different measurement antennas depending on the respective frequency band used for performing the respective OTA measurement, e.g. testing the characteristics of the respective device under test. Typically, the feed switch turns the entire measurement device such that only the measurement antenna required for the respective frequency band is directed towards the device under test, which however results in bending of the cable(s) connected to the respective waveguide-to-cable adapters.

It has turned out that the cables used are sensitive with regard to mechanical stresses or rather mechanical strains that occur due to bending. In some embodiments, the cables assigned to signals with high frequencies are very sensitive with regard to mechanical stresses/strains. Hence, the durability of the cables is impaired due to the bending.

Accordingly, there is a need for an over-the-air measurement system that ensures coverage of different frequency bands for over-the-air measurements while ensuring durability of the measurement system, for example its components.

SUMMARY

Embodiments of the present disclosure provide an over-the-air measurement system for performing over-the-air measurements on a device under test. In an embodiment, the measurement system comprises a measurement device that has: several measurement antennas;

several waveguides, wherein at least one waveguide is assigned to each measurement antenna;

several waveguide-to-cable adapters; and a positioning unit assigned to the measurement antennas.

The number of the waveguide-to-cable adapters is at least identical to the number of the measurement antennas. Further, the positioning unit is configured to move the measurement antennas with respect to the waveguide-to-cable adapters.

Accordingly, a compact multi-band measurement device is provided that comprises at least two different measurement antennas and waveguides assigned thereto. Further, the different measurement antennas covering, for example, different frequency bands, are assigned to respective waveguide-to-cable adapters such that different signals can be forwarded to the respective measurement antenna via the at least one waveguide assigned thereto. The waveguide-to-cable adapters each provide an interface for a cable via which electromagnetic signals may be forwarded to the measurement device. Put differently, each of the waveguide-to-cable adapters is configured to be connected with a respective cable via which the electromagnetic signals are forwarded to the measurement device.

Further, at least one waveguide may be assigned to each measurement antenna, thus forming a measurement unit.

Accordingly, the measurement device has at least two different measurement units assigned, for example, to different frequency bands, which ensures, for example, that at least two different frequency bands are covered by the measurement device.

Since at least two waveguide-to-cable adapters are provided via which signals are inputted, the measurement device has at least two different inputs for covering at least two different frequency bands.

Each of the respective measurement units may be assigned to at least one waveguide-to-cable adapter to which a cable can be connected. However, the waveguide-to-cable adapter and the measurement units may be formed separately with each other ensuring a relative movement between the measurement antennas and the waveguide-to-cable adapters.

In some embodiments, the positioning unit moves the measurement antennas with respect to the waveguide-to-cable adapters such that the respective measurement antenna used for the OTA measurement is directed towards the device under test. In other words, the respective measurement antenna is capable of facing the device under test, via the positioning unit for example, in order to transmit the electromagnetic signals towards the device under test.

The cables connected to the waveguide-to-cable adapters are not moved during the operation of the measurement device, namely the respective OTA measurements. Hence, the cables are not bent, which ensures a higher durability of the overall over-the-air measurement system, for example its components like cables. Put differently, the waveguide-to-cable adapters are not moved during a feed switch of the measurement device, as the measurement antennas are moved relative to the waveguide-to-cable adapters to which the cables are connected during operation of the measurement system. As the cables connected with the waveguide-to-cable adapters do not move and, thus, the cables are not bent, signals with frequencies higher than 50 GHz can be processed by the measurement system, for example the measurement device.

According to an aspect, the positioning unit is configured to move all measurement antennas simultaneously such that, in an operation position, one of the measurement antennas is connected via the at least one waveguide with at least one of the waveguide-to-cable adapters assigned to the respective measurement antenna. Hence, each individual measurement antenna is assigned to a certain waveguide-to-cable adapter via which signals to be transmitted by the respective measurement antenna are inputted. The positioning unit moves the measurement antennas with respect to the at least one waveguide-to-cable adapter such that a signal transmitting connection between the respective measurement antenna and the waveguide-to-cable adapter assigned thereto is obtained in the respective operation position.

In some embodiments, the measurement device has as much different operation positions as measurement antennas since each individual measurement antenna has its own position in which only the respective measurement antenna is connected with the at least one waveguide-to-cable adapter assigned to this respective measurement antenna. The other measurement antennas are not active, as they do not establish a signal transmitting connection with their corresponding waveguide-to-cable adapters.

Another aspect provides that the waveguide-to-cable adapters are stationary whereas the measurement antennas are movable. Thus, the positioning unit in these embodiments move the measurement antennas, whereas the respective waveguide-to-cable adapters are maintained in their respective positions even though the measurement antennas are moved.

In some embodiments, at least one of the waveguide-to-cable adapters may comprise a waveguide switch. Thus, two waveguides may be assigned to a single waveguide-to-cable adapter such that switching between two different frequency bands is possible while using a single waveguide-to-cable adapter.

According to another aspect, the measurement antennas are fixedly attached to a main body that is moved by the positioning unit. Thus, the positioning unit interacts with the singular main body in some embodiments to which the different measurement antennas are connected in order to move all measurement antennas simultaneously.

In some embodiments, the waveguides are established within the main body. The waveguides are also moved with respect to the waveguide-to-cable adapters if the positioning unit moves the measurement antennas. Put differently, the measurement antennas and the waveguides in these embodiments are located at or rather within the same main body so that a movement of the measurement antennas results in a movement of the waveguides with respect to the waveguide-to-cable adapters that are assigned to the waveguides. Thus, the signal-transmitting connection between the measurement antennas and the waveguides is maintained continuously.

In other words, the waveguides are optionally integrated within the main body at the outer surface of which the measurement antennas are located.

For instance, the positioning unit is configured to at least one of linearly displace and rotate the main body. Thus, the main body may be rotated solely by the positioning unit. Alternatively, the main body may be displaced solely in a linear manner by means of the positioning unit. Furthermore, the positioning unit may be configured to rotate and to displace the main body in a linear manner. Thus, the positioning unit may include a multi-axis positioner that is configured to align the measurement antennas with the respective waveguide-to-cable adapters, for example a measurement antenna with the waveguide-to-cable adapter assigned thereto.

In some embodiments, the positioning unit rotates the main body so as to align the at least one waveguide with the waveguide-to-cable adapter assigned thereto. Afterwards, the positioning unit displaces the main body in a linear manner such that an opening or rather input port of the waveguide establishes a signal-transmitting connection with the respective waveguide-to-cable adapter.

The linear displacement of the main body may relate to a slide movement of the main body, and carried out, for example, via any motor driven jack screw, pneumatic or hydraulic controlled linear actuator, a single axis, motor controlled slide table or stage (e.g., x-axis table, y-axis table, etc.)

Put differently, the positioning may relate to a rotation of the main body around a rotational axis in order to align the waveguides of the respective measurement unit with the corresponding waveguide-to-cable adapters. Such rotation of the main body can be carried out, for example, by a rotational motor, a motor controlled rotation table or stage, etc. The subsequent linear movement of the main body ensures that the main body slides into the waveguide-to-cable adapter in order to obtain an electrical sealing. In some embodiments, the main body may be moved linearly along the rotational axis.

As mentioned above, the positioning unit may also relate to a linear slide mechanism that is configured to switch between the different waveguide-to-cable adapters.

Generally, the different waveguide-to-cable adapters correspond to different inputs, feed ports or rather feeds of the measurement device. However, these inputs, feed ports or rather feeds are fixed in their respective positions even though the measurement antennas are moved.

In some embodiments, the main body may relate to or formed like a drum. In other words, the main body has a cylindrical shape such as a revolver. The drum or rather the revolver can be rotated easily by the positioning unit while ensuring a signal transmission line with the waveguide-to-cable adapters. In some of these embodiments, the center axis of the main body may relate to its rotational axis.

The waveguide-to-cable adapters may be located at a connecting body. The connecting body may be formed separately with respect to the main body. For example, the connecting body may have a fixed position with respect to the main body at which the measurement antennas are located. The connecting body may also be called feed assembly, as the respective signals are fed via the connecting body by cables connected thereto.

For instance, the connecting body is established by, for example, a plate, a disk, an angled body, a clip and/or a cup. The plate and/or the disk are/is a substantially planar body that may be located on top of the main body in order to interact with the waveguides established within the main body. In contrast thereto, the angled body, the clip and/or the cup may extend in at least two substantially perpendicular directions. Thus, the angled body, the clip and/or the cup may contact the main body at its upper side and at a lateral side simultaneously.

The angled body and/or the clip may be established by two plate-like parts that are connected with each other at their edges facing each other, wherein the first part extends in a first direction that is substantially perpendicular to the second direction in which the second part extends.

The angled body and/or the clip may further extend in a third direction, for instance a circumferential direction of the main body.

Hence, the angled body and/or the clip in some embodiments is formed like a "T" ("T-shaped"), wherein the first part intersecting the second part in its middle may be angled, for example by 90°, such that the first part is placed on the upper side of the main body and it extends along the lateral side of the main body. The second part of the T-shaped clip and/or angled body extends along the circumferential direction of the main body.

For instance, the cup partially surrounds the main body. This means that the cup-shaped connecting body covers an upper surface of the main body as well as its lateral side at least partially, for example the entire shell surface of the main body is accommodated by the cup-shaped connecting body.

Another aspect provides that the waveguide-to-cable adapters are established by waveguide-to-coaxial adapters. Hence, coaxial cables can be connected with the waveguide-to-cable adapters in order to forward the respective signals to the measurement device.

Furthermore, each of the measurement antennas may be a single-polarized antenna and/or a dual-polarized antenna. Thus, the measurement antennas may receive dual-polarized electromagnetic signals, namely horizontally polarized and vertically polarized signals. In case of dual-polarized antennas, two waveguides may be assigned to each measurement antenna in order to forward the different polarized signals to the respective measurement antenna.

However, the measurement antennas may also be established by single-polarized antennas such that a single waveguide as well as a single waveguide-to-cable adapter is sufficient per measurement antenna.

In some embodiments, the measurement device comprises several orthomode transducers, wherein each measurement antenna is assigned to one orthomode transducer.

Each measurement unit may comprise one orthomode transducer. For example, an orthomode transducer is used in case of dual-polarized measurement antennas, as the respective orthomode transducer receives the differently polarized signals in order to combine the differently polarized signals to a single signal forwarded to the respective measurement antenna for being transmitted via the measurement antenna.

Generally, an orthomode transducer is a waveguide component that serves either to combine or to separate two orthogonally polarized signal paths. The signal paths may be provided by the different waveguide-to-cable adapters solely that are assigned to one common measurement antenna. Alternatively, the waveguide-to-cable adapters are connected with waveguides that merge into the orthomode transducer.

For instance, one orthomode transducer and the measurement antenna assigned thereto are established by a single unit in an integrated manner. The single unit may relate to the measurement unit that also comprises the at least one waveguide. This means that the orthomode transducer and the measurement antenna assigned thereto correspond to an integrally formed member that is located within the measurement device, for example the main body.

In general, the orthomode transducer may be connected directly with the waveguide-to-cable adapters such that the signal paths to be combined are established by the waveguide-to-cable adapters. Hence, a single waveguide extends from the orthomode transducer to the respective measurement antenna.

Alternatively, the orthomode transducer is connected directly with the respective measurement antenna, wherein two waveguides extend from the waveguide-to-cable adapters to the respective orthomode transducer.

In some embodiments, the orthomode transducer is located between the measurement antenna and the waveguide-to-cable adapters. Then, two waveguides extend from the waveguide-to-cable adapters to the respective orthomode transducer from which a single waveguide extends to the measurement antenna.

For instance, each orthomode transducer comprises a mixer. The mixer ensures that the respective frequencies of the differently polarized signals are adapted to each other and/or mixed to a respective frequency.

Furthermore, each measurement antenna may be assigned to two waveguides, each having an input port. The input ports of the waveguides interact with the waveguide-to-cable adapters. Thus, the signals forwarded via the cables connected to the waveguide-to-cable adapters are inputted into the respective waveguides via their input ports provided that the measurement device is in its respective operation position in which the waveguides are aligned with the respective waveguide-to-cable adapters.

Generally, differently polarized signals may be forwarded to the measurement antenna. The first polarized signals are forwarded via a first waveguide, whereas second polarized signals are forwarded via a second waveguide. As discussed above, both waveguides may be assigned to the corresponding orthomode transducer that processes both differently polarized signals in an appropriate manner.

In some embodiments, the input ports of the waveguides assigned to one measurement antenna may be located at a common side of the main body. For instance, the input ports are located at an upper side of the main body. The input ports located at the common side interact with the waveguide-to-cable adapters provided by the connecting body that may be placed on top of the main body if the measurement device is brought into the respective operation position in which the input ports are aligned with the fixed waveguide-to-cable adapters.

In another embodiment, the input ports of the waveguides assigned to one measurement antenna are located at two sides that are perpendicular to each other. This embodiment relates, for example, to a connecting body that is established by the angled body, the clip and/or the cup.

In some embodiments, the cup-shaped connecting body partially encompasses the main body that is rotated in a space defined by the cup at least partially. Put differently, the cup-shaped connecting body partially accommodates the main body.

In a similar manner, the angled body and/or the clip in some embodiments may be assigned to a space in which the main body is located. The angled body and/or the clip are not fixed to the main body such that the main body may rotate within the space relative to the angled body and/or the clip. This relative movement ensures that the input ports of the waveguides are aligned with the non-movable waveguide-to-cable adapters.

The over-the-air measurement system may also comprise at least one of the device under test and a shielded chamber. The device under test may be located within the shielded chamber in order to shield the device under test from interfering and/or disturbing signals that originate from the environment. Hence, the shielded chamber ensures good testing conditions for performing the respective over-the-air measurements on the device under test.

According to another aspect, an interface area between each of the measurement antennas and the waveguides assigned thereto is lapped smoothly. Thus, electromagnetic losses in the interface area of the waveguides and the measurement antenna connected thereto can be reduced to a minimum.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
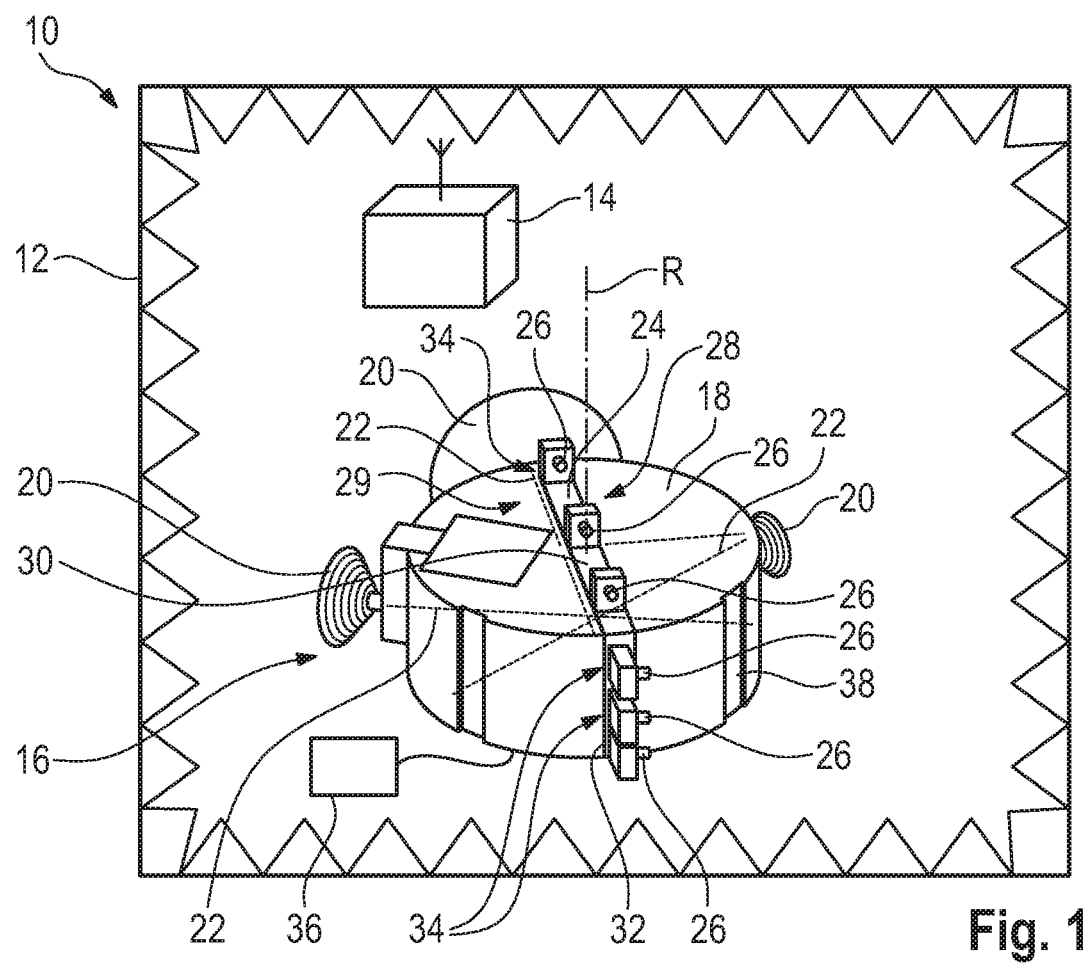
FIG. 1 schematically shows a representative embodiment of an over-the-air measurement system according to the present disclosure.

FIG. 1 shows schematically a representative embodiment of an over-the-air measurement system 10 for performing over-the-air measurements (OTA measurements). The over-the-air measurement system 10 comprises a shielded chamber 12 in which a device under test 14 is located on which the OTA measurements are performed.

For performing the OTA measurements, the measurement system 10 also comprises a measurement device 16 that is shown in more detail in FIG. 1. The measurement device 16 has a main body 18 at which several different measurement antennas 20 are located to which internal waveguides 22 are assigned.

In the embodiment shown, the waveguides 22 are integrated within the main body 18 wherein the waveguides 22 are fed with signals to be forwarded to the measurement antennas 20 for being emitted. Hence, the waveguides 22 extend to the outer surface of the main body 18 for merging via an interface area into the respective measurement antenna 20. The respective interface area is lapped smoothly such that electrical losses are minimized. As the waveguides 22 are integrated within the main body 18, they are illustrated by dashed lines in FIG. 1.

The measurement device 16 also includes a connecting body 24 that is formed separately with respect to the main body 18. In the embodiment shown, the connecting body 24 comprises several waveguide-to-cable adapters 26. The waveguide-to-cable adapters 26 correspond to interfaces for the waveguides 22 and external cables connected with the waveguide-to-cable adapters 26. The respective cables may relate to coaxial cables such that the waveguide-to-cable adapters 26 are waveguide-to-coaxial adapters. However, the cables are not shown in FIG. 1 for simplifying purposes.

The waveguide-to-cable adapters 26 are configured to provide an interface for the waveguides 22 that can be aligned with the waveguide-to-cable adapters 26 as will be described later in more detail.

Generally, the number of the waveguide-to-cable adapters 26 is at least identical to the number of measurement antennas 20.

In the embodiment of FIG. 1, two waveguide-to-cable adapters 26 are provided for each measurement antenna 20, as the respective measurement antennas 20 each relate to dual-polarized measurement antennas 20 such that each of the measurement antennas 20 is fed with two differently polarized signals via the at least two different waveguide-to-cable adapters 26.

Accordingly, horizontally polarized signals are forwarded via a first cable connected to the first of the two different waveguide-to-cable adapters 26 assigned to a single measurement antenna 20 wherein vertically polarized signals are forwarded via a second cable connected to the second of the two different waveguide-to-cable adapters 26 assigned to the same single measurement antenna 20.

For processing the differently polarized signals, the respective measurement antenna 20 may be assigned to an orthomode transducer 28 that receives the differently polarized signals and combines the differently polarized signals received to a single signal that is forwarded to the respective measurement antenna 20.

Since three different measurement antennas 20 are provided, the measurement device 16 comprises three different orthomode transducers 28. In this embodiment, each orthomode transducer 28 interacts with two waveguide-to-cable adapters 26 while receiving horizontally polarized signals as well as vertically polarized signals via the respective waveguide-to-cable adapters 26.

Moreover, each orthomode transducer 28 may have a mixer 29 in order to adapt the frequency of at least one of the differently polarized signals, for example both differently polarized signals. This simplifies the combining of the differently polarized signals in order to forward a single signal to the respective measurement antenna 20. The mixer 29 may be located within the measurement device 16.

Each measurement antenna 20, the at least one waveguide 22 assigned thereto and/or the corresponding orthomode transducer 28 may be established as a single integrated unit, which may be called a measurement unit. The respective measurement unit may be incorporated into the main body 18 in order to provide the measurement device 16. Thus, the main body 18 may relate to a housing into which the integrally formed measurement units are incorporated for establishing the measurement device 16 as shown in FIG. 1.

Alternatively to the dual-polarized measurement antennas 20, the measurement antennas 20 may also be established by single-polarized antennas. Then, each measurement antenna 20 may be assigned to a single waveguide as well as only one waveguide-to-cable adapter 26 via which the signals to be transmitted are inputted. Thus, the number of waveguide-to-cable adapters 26 is identical to the number of measurement antennas 20.

In the shown embodiment, the connecting body 24 is established by an angled body that is placed on the upper side of the main body 18 while contacting a lateral side of the main body 18 simultaneously.

In some embodiments, the main body 18 is formed as a drum or rather a revolver, which has a cylindrical shape such that the lateral side of the main body 18 relates to a shell surface of the main body 18.

The connecting body 24 comprises a first part 30 assigned to the upper side of the main body 18 and a second part 32 assigned to the lateral side of the main body 18, for example the shell surface. Both parts 30, 32 are connected with each other while being perpendicular to each other as shown in FIG. 1. However, neither the entire shell surface nor the entire upper side of the main body 18 is covered by the respective connecting body 24, but parts thereof. As discussed above, the waveguide-to-cable adapters 26 provide the interface for the waveguides 22 integrated in the main body 18 as well as the cables forwarding the signals to be emitted by the measurement device 16.

In the shown embodiment, the cables for forwarding the vertically polarized signals may be located at the first part 30 of the connecting body 24. Thus, the vertically polarized signals are inputted via the upper side of the main body 18.

Furthermore, the cables for forwarding the horizontally polarized signals may be located at the second part 32 of the connecting body 24. Hence, the horizontally polarized signals are inputted via the lateral side of the main body 18.

The several waveguides 22 integrated within the main body 18 each have an input port 34 that interacts with the corresponding waveguide-to-cable adapter 26 when the main body 18 is aligned appropriately in a respective operational position of the measurement device 16.

The measurement device 16 has different operational positions, wherein each operational position is defined in that the input ports 34 of the waveguides 22, which are connected with the respective measurement antenna 20 intended for the OTA measurement, are aligned with the corresponding waveguide-to-cable adapters 26 assigned thereto. Thus, a signal transmission line is established from the respective waveguide-to-cable adapters 26 to the assigned measurement antenna 20. The respective signal transmission line comprises the respective waveguides 22 as well as the waveguide-to-cable adapters 26.

In the shown embodiment, the measurement device 16 has three different operation positions as three different measurement antennas 20 are provided.

In some embodiments, the input ports 34 of the waveguides 22 assigned to one measurement antenna 20 are located at two sides of the main body 18, wherein the sides are perpendicular to each other. The input ports 34 are located at the upper side and the lateral side of the main body 18.

The measurement device 16 further comprises a positioning unit 36 that is associated with the main body 18 and configured to move the main body 18 with respect to the connecting body 24 that always remains in its respective position. Thus, the measurement antennas 20, which are located at the main body 18, are moved with respect to the connecting body 24, namely the waveguide-to-cable adapters 26 provided within the connecting body 24.

Accordingly, it is ensured that the respective measurement antenna 20 is moved into its respective measurement position, in which the measurement antenna 20 faces the device under test 14. The measurement position corresponds to the respective operational position of the measurement device 16.

As the positioning unit 36 moves the main body 18, all measurement antennas 20 are moved simultaneously with respect to the waveguide-to-cable adapters 26 that are located at the stationary connecting body 24. The connecting body 24 as well as the waveguide-to-cable adapters 26 are maintained at their respective positions when the main body 18 moves. Hence, the cables connected to the waveguide-to-cable adapters 26 remain in their positions during the movement of the measurement antennas 20 such that no bending or mechanical stresses of the cables occur.

Since the waveguides 22 are integrated within the main body 18, the waveguides 22 are also moved with respect to the waveguide-to-cable adapters 26 once the positioning unit 36 moves the main body 18.

In the shown embodiment, the positioning unit 36 is configured to rotate the main body 18 with respect to a rotational axis R that is assigned to a center axis of the drum-shaped main body 18. Further, the positioning unit 36 is configured to move the main body 18 in a linear manner, for example along the rotational axis R.

In general, the different measurement antennas 20 are provided in order to cover a large frequency range, as each measurement antenna 20 and the components assigned thereto are used to cover a certain frequency band such that the entire measurement device 16 covers a large frequency range, for instance from 20 to 90 GHz.

Via the cables assigned to the individual measurement antennas 20 the respective signals are forwarded that are processed internally, for instance by the orthomode transducers 28.

For testing the device under test 14 with respect to the different frequency bands, the measurement device 16 is brought into its respective operational position for testing a certain frequency band. If the measurement device 16 is brought into an operation position in which another measurement antenna 20 faces the device under test 14, for instance the left one or the right one shown in FIG. 1, the positioning unit 36 displaces the main body 18 with respect to the connecting body 24 in a linear manner along the rotational axis R. Thus, the main body 18 is driven out of the space at least partially covered by the connecting body 24. Then, the positioning unit 36 rotates the main body 18 about the rotational axis R such that the respective input ports 34 of the waveguides 22 assigned to the measurement antenna 20 intended for testing are aligned with the connecting body 24, for example the respective waveguide-to-cable adapters 26 provided by the connecting body 24.

Once the input ports 34 of the waveguides 22 are aligned with the respective waveguide-to-cable adapters 26, the positioning unit 36 moves the main body 18 linearly along the rotational axis R. In other words, the positioning unit 36 drives the main body 18 into the space partially covered by the connecting body 24 such that the input ports 34 contact the waveguide-to-cable adapters 26.

This procedure in some embodiments relates to a feed switch of the measurement device 16, as another measurement antenna 20 as well as other cables assigned thereto are used for the OTA measurements. In other words, another frequency band can be used.

However, the connecting body 24 as well as the waveguide-to-cable adapters 26 provided by the connecting body 24 are maintained in their position during the feed switching procedure described above, as the main body 18 is moved solely by the positioning unit 36, for example displaced linearly, rotated and displaced linearly again.

As shown in FIG. 1, the main body 18 may have grooves 38 at its outer side that are used for aligning the main body 18 with respect to the connecting body 24. Hence, the respective groove 38 accommodates the connecting body 24 when the measurement device 16, for example the main body 18, is driven into a new operation position. The number of grooves 38 correspond to the number of operation positions of the measurement device 16.

In some embodiments, the positioning unit 36 includes a rotating motor in combination with a linear actuator, for example a vertical actuator. Alternatively, the positioning unit 36 includes a linear motor, for example a vertical motor, in combination with a rotational actuator.

Figure 2:
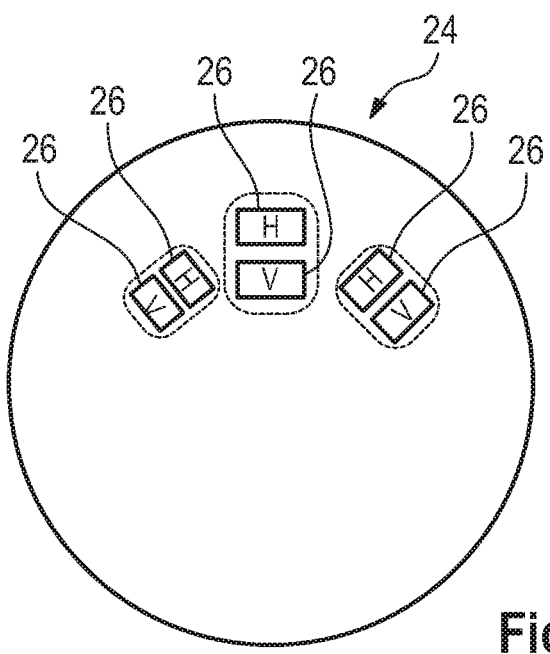
FIG. 2 shows a representative embodiment of a connecting body of a measurement device used by the measurement system shown in FIG. 1.

In FIG. 2, another embodiment of the connecting body 24 is shown, which at is formed as a plate, for example like a disk-shaped plate. Hence, the connecting body 24 relates to a disk. The disk-shaped connecting body 24 can be placed on top of the main body 18, which may be formed as a drum or rather a revolver again. The several waveguide-to-cable adapters 26 are established in the disk-shaped connecting body 24, namely at a common side as shown in FIG. 2.

In this embodiment, two waveguide-to-cable adapters 26 are assigned to one feed, as vertically and horizontally polarized signals may be fed via both waveguide-to-cable adapters 26 of one feed. The pairs of waveguide-to-cable adapters 26 are indicated by dashed lines in FIG. 2.

As the waveguide-to-cable adapters 26 are located at a common side, the input ports 34 of the waveguides 22 are also located at a common side of the main body 18, namely its upper side on which the connecting body 24 is placed. Hence, the waveguide-to-cable adapters 26 and the input ports 34 directly interface with each other provided that the connecting body 24 and the main body 18 are aligned with each other.

Figure 3A:
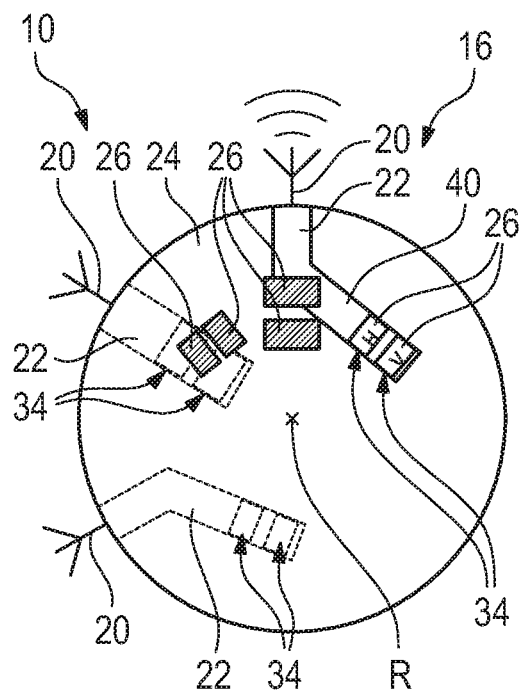
FIGS. 3a to 3c show different operation positions of the measurement device with the connecting body shown in FIG. 2.
Figure 3B:
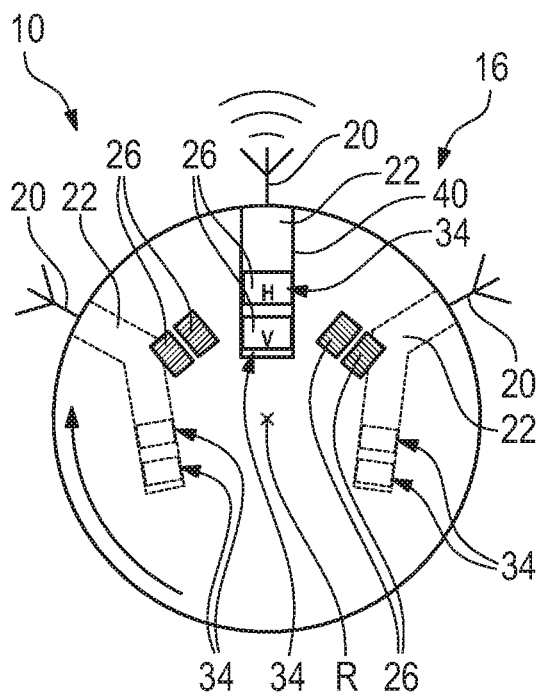
Figure 3C:
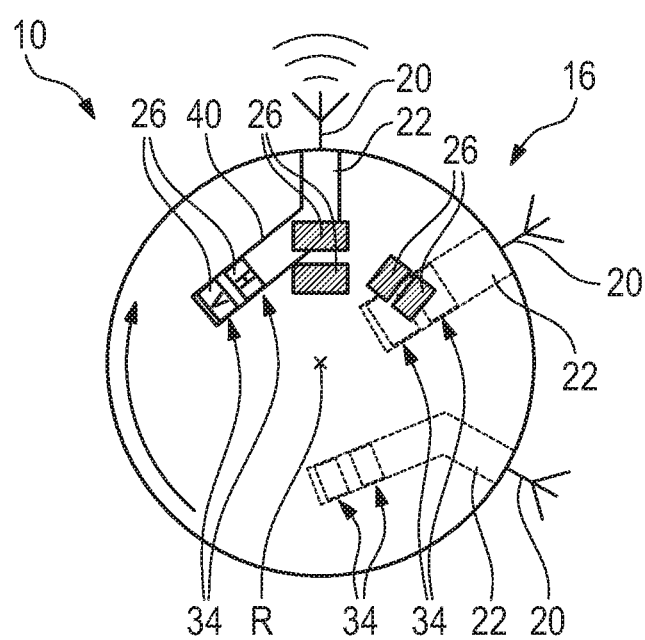

FIGS. 3a-3c show three different operation positions of the measurement device 16 that uses the connecting body 24 shown in FIG. 2.

Three different operation positions are indicated by 1, 2, and 3 wherein these operation positions relate, for example, to three different frequency bands indicated by X, Y, and Z used for testing the device under test 14 not shown in FIGS. 3a-3c. For instance, the first frequency band X relates to a frequency of 23 to 43 GHz, the second frequency band Y relates to a frequency of 43 to 65 GHz, and the third frequency band Z relates to a frequency of 65 to 90 GHz.

Accordingly, the main body 18 is rotated about the rotational axis R with respect to the disk-shaped connecting body 24 once the positioning unit 36 (not shown here) moves the main body 18. Hence, the measurement antennas 20 as well as the waveguides 22 assigned thereto are rotated about the rotational axis R with respect to the connecting body 24 that remains stationary as shown in FIGS. 3a-3c.

In a first operation position, a first of the measurement antennas 20 is connected via its at least one waveguide 22 with the corresponding waveguide-to-cable adapters 26 in order to receive the horizontally and vertically polarized signals that are fed by the respective cables connected with the waveguide-to-cable adapters 26. This results in a signal transmission line 40 highlighted in FIG. 3a.

As discussed previously, the orthomode transducer 28 assigned thereto combines the horizontally polarized signals as well as the vertically polarized signals in order to forward a single signal towards the measurement antenna 20 used for testing the device under test 14.

The other waveguide-to-cable adapters 26 are also connected with their respective cables. However, the waveguides 22, for example their input ports 34, are not aligned with the other waveguide-to-cable adapters 26 such that no further signal transmission line is obtained.

If another frequency band, for instance the frequency band Y, shall be tested, the main body 18 is rotated about the rotational axis R with respect to the disk-shaped connecting body 24 by the positioning unit 36 as indicated in FIG. 3b. Then, the next measurement antenna 20 establishes a signal transmission line 40 with the assigned waveguide-to-cable adapters 26 and the cables connected therewith while the former signal transmission line is broken.

If a further frequency band, for instance the frequency band Z, shall be tested, the main body 18 is rotated again about the rotational axis R with respect to the disk-shaped connecting body 24 by the positioning unit 36 as indicated in FIG. 3c. Then, the next measurement antenna 20 establishes a signal transmission line 40 with the assigned waveguide-to-cable adapters 26 and the cables connected therewith while the former signal transmission line is broken.

The different positions shown in FIGS. 3a-3c relate to different operation positions of the measurement device 16. Depending on the operation position, a different frequency band is used for testing the over-the-air characteristics of the device under test 14 located within the shielded chamber 12.

Put differently, in the first operation position, the first measurement antenna 20 assigned to the first frequency band X establishes the signal transmission line 40, wherein, in the second operation position, the second measurement antenna 20 assigned to the second frequency band Y establishes the signal transmission line 40, and wherein, in the third operation position, the third measurement antenna 20 assigned to the third frequency band Z establishes the signal transmission line 40. Hence, in each operation position of the measurement device 16, only a single signal transmission line 40 is established.

In the shown embodiment, the positioning unit 36 simply rotates the main body 18 about the rotational axis R with respect to the stationary connecting body 24 in order to reach the different operation positions. In one embodiment, rotation can be carried out by a controllable rotational motor, a motor controlled rotation table, etc. Thus, no linear movement is necessary in contrast to the embodiment shown in FIG. 1 as described previously.

In general, the main body 18 is moved solely by the positioning unit 36 such that the cables connected with the waveguide-to-cable adapters 26 are not moved and bent due to a movement of the waveguide-to-cable adapters 26.

This is apparent when inter alia taking FIGS. 3a-3c and the locations of the waveguide-to-cable adapters 26 into account, which remain stationary even though three different operation positions are shown in these FIGURES.

Figure 5:
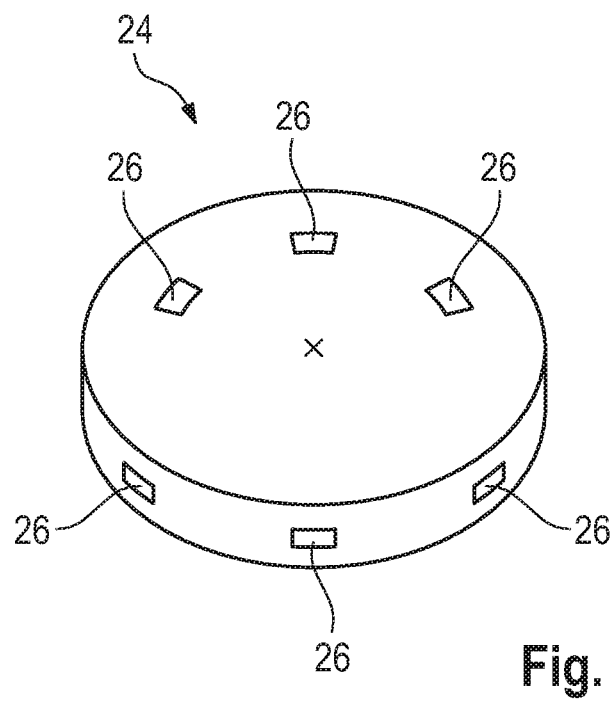
FIG. 5 shows a perspective view of a connecting body of a measurement device according to yet another embodiment.

In FIG. 5, another embodiment of the connecting body 24 is shown that substantially equals the one shown in FIGS. 2 and 3, as the connecting body 24 is shaped like a cup.

The waveguide-to-cable adapters 26 may be located at the upper side of the cup-shaped connecting body 24 such that the locations of the waveguide-to-cable adapters 26 correspond to the ones of the disk-shaped connecting body 24 shown in FIGS. 2 and 3. Alternatively, the waveguide-to-cable adapters 26 are located at the upper side and a lateral side of the cup-shaped connecting body 24 as schematically illustrated in FIG. 5.

The locations of the input ports 34 of the waveguides 22 substantially correspond to the ones shown in FIG. 1, as they are provided at two sides perpendicular to each other.

The cup-shaped connecting body 24 may define an internal space in which the main body 18 may be accommodated wherein the positioning unit 36 rotates and/or moves the main body 18 linearly in order to align the input ports 34 with the waveguide-to-cable adapters 26.

Figure 4:
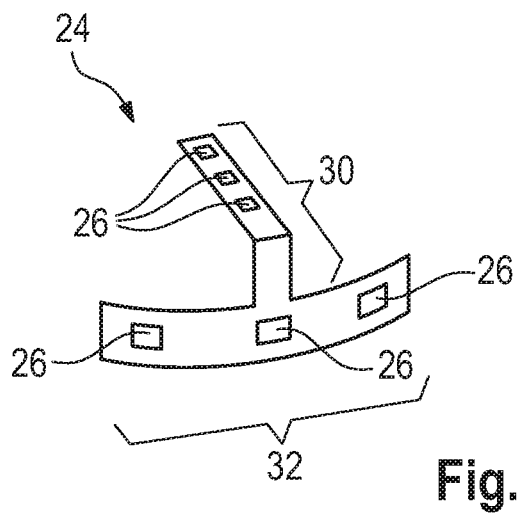
FIG. 4 shows a perspective view of a connecting body of a measurement device according to another embodiment.

Referring now to FIG. 4, another embodiment of the connecting body 24 is shown. In this embodiment, the connecting body 24 is an angled body and/or a clip that is substantially T-shaped. In that regard, the first part 30 of the connecting body 24 merges into the second part 32 in its middle. However, the first part 30 is angled, for example by 90°, such that the first part 30 is placed on the upper side of the main body 18, wherein the first part 30 partially extends along the lateral side of the main body 18. Further, the second part 32 of the T-shaped connecting body 24 extends along the circumferential direction of the main body 18 and, thus, the second part 32 is bent in order to contact the curved main body 18.

Accordingly, the embodiment shown in FIG. 4 relates to a combination of the embodiments shown in FIGS. 1 and 5, as the first part 30 corresponds to the portion of the connecting body 24 shown in FIG. 1 whereas the second part 32 corresponds to a portion of the lateral side of the connecting body 24 shown in FIG. 5.

In a similar manner to the first embodiment shown in FIG. 1, the positioning unit 36 may rotate and/or linearly move the main body 18 with respect to the connecting body 24 in order to align the input ports 34 of the waveguides 22 with the respective waveguide-to-cable adapters 26.

Again, the waveguide-to-cable adapters 26 for receiving the vertically polarized signals may be assigned to the first part 30, for example the portion assigned to the upper surface of the main body 18, whereas the waveguide-to-cable adapters 26 for receiving the horizontally polarized signals may be assigned to the second part 32.

In any case, the measurement system 10 ensures that the main body 18 with the measurement antennas 20 is moved, for example rotated and/or linearly displaced by the positioning unit 36, with respect to the connecting body 24 that remains stationary. Moreover, the main body 18 may solely be moved by the positioning unit 36 in a linear manner in order to switch between different frequency bands.

In these embodiments, the measurement device 16 has at least two feeding inputs provided by the waveguide-to-cable adapters 26 to which the cables are connected. The measurement device 16 corresponds to a compact multi-band measurement device that has the main body 18 that can be moved by the positioning unit 36, which can include a multi-axis positioner.

In addition, the connecting body 24 is not fixed to the main body 18, as a relative movement is possible. As the connecting body 24 comprises the waveguide-to-cable adapters 26 to which the cables are connected, it is ensured that different measurement positions can be obtained without moving the cables such that the cables are not bent.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air measurement system for performing over-the-air measurements on a device under test, said measurement system comprising a measurement device, said measurement device further comprising:
   several measurement antennas;
   several waveguides, wherein at least one waveguide is assigned to each measurement antenna;
   several waveguide-to-cable adapters; and
   a positioning unit assigned to said measurement antennas,
   wherein the number of said waveguide-to-cable adapters is at least identical to the number of said measurement antennas, and
   wherein said positioning unit is configured to move said measurement antennas with respect to said waveguide-to-cable adapters.

2. The over-the-air measurement system according to claim 1, wherein said positioning unit is configured to move all measurement antennas simultaneously such that, in an operation position, one of said measurement antennas is connected via said at least one waveguide with at least one of said waveguide-to-cable adapters assigned to said respective measurement antenna.

3. The over-the-air measurement system according to claim 1, wherein said waveguide-to-cable adapters are stationary whereas said measurement antennas are movable.

4. The over-the-air measurement system according to claim 1, wherein said measurement antennas are fixedly attached to a main body that is moved by said positioning unit.

5. The over-the-air measurement system according to claim 4, wherein said waveguides are established within said main body.

6. The over-the-air measurement system according to claim 4, wherein said positioning unit is configured to at least one of linearly displace and rotate said main body.

7. The over-the-air measurement system according to claim 4, wherein said main body relates to a drum.

8. The over-the-air measurement system according to claim 1, wherein said waveguide-to-cable adapters are located at a connecting body.

9. The over-the-air measurement system according to claim 8, wherein said connecting body is established by at least one of a plate, a disk, an angled body, a clip and a cup.

10. The over-the-air measurement system according to claim 1, wherein said waveguide-to-cable adapters are established by waveguide to coaxial adapters.

11. The over-the-air measurement system according to claim 1, wherein each of said measurement antennas is at least one of a single-polarized antenna and a dual-polarized antenna.

12. The over-the-air measurement system according to claim 1, wherein each measurement antenna is assigned to two waveguides each having an input port.

13. The over-the-air measurement system according to claim 12, wherein the input ports of the waveguides assigned to one measurement antenna are located at a common side.

14. The over-the-air measurement system according to claim 12, wherein the input ports of the waveguides assigned to one measurement antenna are located at two sides being perpendicular to each other.

15. The over-the-air measurement system according to claim 1, wherein said over-the-air measurement system comprises at least one of a device under test and a shielded chamber.

16. The over-the-air measurement system according to claim 1, wherein an interface area between each of said measurement antennas and said waveguides assigned thereto is lapped smoothly.

17. An over-the-air measurement system for performing over-the-air measurements on a device under test, said measurement system comprising a measurement device, said measurement device further comprising:
several measurement antennas;
several waveguides, wherein at least one waveguide is assigned to each measurement antenna;
several waveguide-to-cable adapters; and
a positioning unit assigned to said measurement antennas,
wherein the number of said waveguide-to-cable adapters is at least identical to the number of said measurement antennas,
wherein said positioning unit is configured to move said measurement antennas with respect to said waveguide-to-cable adapters, and
wherein said measurement device comprises several orthomode transducers, each measurement antenna being assigned to one orthomode transducer.

18. The over-the-air measurement system according to claim 17, wherein one orthomode transducer and said measurement antenna assigned thereto are established by a single unit in an integrated manner.

19. The over-the-air measurement system according to claim 17, wherein said orthomode transducers each comprise a mixer.

20. An over-the-air measurement system for performing over-the-air measurements on a device under test, said measurement system comprising a measurement device, said measurement device further comprising:
several measurement antennas;
several waveguides, wherein at least one waveguide is assigned to each measurement antenna;
several waveguide-to-cable adapters; and
a positioning unit assigned to said measurement antennas,
wherein the number of said waveguide-to-cable adapters is at least identical to the number of said measurement antennas,
wherein said positioning unit is configured to move said measurement antennas with respect to said waveguide-to-cable adapters when performing over-the-air measurements on the device under test, and
wherein the cables connected to the waveguide-to-cable adapters are not moved during the operation of the measurement device when performing over-the-air measurements on the device under test.

* * * * *